United States Patent
Jan et al.

[11] Patent Number: 5,479,128
[45] Date of Patent: Dec. 26, 1995

[54] SINGLE RAM MULTIPLE-DELAY VARIABLE DELAY CIRCUIT

[75] Inventors: Yung-Jung Jan, Taipei Hsien; Po-Chuan Huang, Hsinchu; Ching-Hsiang Yang, Chia-Li, all of Taiwan

[73] Assignee: Industrial Technology Research Institute, Hsinchu, Taiwan

[21] Appl. No.: 213,852

[22] Filed: Mar. 16, 1994

[51] Int. Cl.$^6$ .................................................. G11C 7/00
[52] U.S. Cl. ........................... 327/270; 327/261; 365/194
[58] Field of Search ................................. 327/231, 235, 327/236, 241, 244, 261, 262, 263, 265, 269, 270, 273, 276, 279, 286; 365/194, 189.12, 230.06, 236

[56] References Cited

U.S. PATENT DOCUMENTS

| | | | |
|---|---|---|---|
| 4,506,348 | 3/1985 | Miller et al. | 365/194 |
| 4,549,283 | 10/1985 | McDermott, III | 365/194 |
| 4,876,670 | 10/1989 | Nakabayashi et al. | 365/194 |
| 4,945,518 | 7/1990 | Muramatsu et al. | 365/236 |
| 4,953,128 | 7/1990 | Kawai et al. | 365/194 |
| 4,961,169 | 10/1990 | Matsumura et al. | 365/194 |
| 5,200,925 | 4/1993 | Morooka | 365/189.12 |
| 5,406,518 | 4/1995 | Sun et al. | 365/194 |

*Primary Examiner*—Timothy P. Callahan
*Assistant Examiner*—T. Lam
*Attorney, Agent, or Firm*—Meltzer, Lippe, Goldstein et al.

[57] ABSTRACT

A multiple-delay variable delay circuit uses a random access memory (RAM) array to provide adjustable delay of a block of input data, such as previously necessitated use of an extensive shift register configuration. A single RAM array, having a given capacity, is used to economically provide individual delays to a plurality of blocks of input data, with the aggregate of the individual delays not exceeding the capacity of the single RAM array. Time-shared use of a high speed RAM enables simultaneous single-port processing of data blocks, with delay control circuits providing utilization of separate portions of the RAM capacity, to provide individual delays resulting from successive read/write cycles utilizing a desired total of incremental delays. Simplified delay control circuits provide manufacturing and operating economies with single-port or multi-port RAM arrays.

16 Claims, 4 Drawing Sheets

SINGLE RAM MULTIPLE-DELAY VARIABLE DELAY CIRCUIT

This invention relates to variable delay circuits and, more particularly, to economical applications of random access memory (RAM) circuits to replace conventional shift registers in digital equalizer, ghost cancellation and related types of systems.

BACKGROUND OF THE INVENTION

Programmable shift registers have conventionally been used to provide variable (e.g., adjustable) delays of blocks of data in video and other systems, for purposes such as frame synchronization, ghost cancellation, etc. FIG. 1 provides a block diagram of a typical prior art variable shift register of a conventional form. In operation of the FIG. 1 shift register, delay of a block of input data is achieved basically by reading the data into and out of one or more of a series of registers R1–Ri, as selected via a delay decoder, on a timed basis as controlled by a clock signal. If reading into and out of a single register produces one increment of delay, a desired delay of ten delay increments is achieved by successively reading the data into and out of ten registers. An extended delay capability thus entails a large number of registers and complex support circuitry, with accompanying attributes of relatively high power consumption and extensive semiconductor size requirements resulting in increased manufacturing and operating costs. A conventional shift register, such as illustrated in FIG. 1, is described in greater detail in U.S. Pat. No. 4,953,128, issued Aug. 28, 1990.

In the prior art, efforts have been made to address the cost and operating disadvantages of conventional shift registers by replacing a shift register with a RAM circuit configured to provide a variable delay. Thus, where a video line or frame, for example, is to be delayed by being subjected to a repetitive read/write cycle of total duration corresponding to a desired delay, arrangements have been described whereby the desired result is provided by use of a single RAM array. The RAM thus replaces the series of individual registers as shown in FIG. 1, in order to provide a variable delay for a single block of input data. Single port RAM delay arrangements are shown and the basics of operation are described in some detail, in U.S. Pat. Nos. 4,953,128 (noted above) and 4,876,670, issued Oct. 24, 1989.

However, in a ghost cancellation system or digital communications equalizer, a large number of individual variable delays are required. Typically, each tap bank in the system architecture will entail a requirement for a separate variable delay facility which is individually adjustable to provide a selectable delay. Thus, even with a bank of registers in a shift register replaced by a single RAM array, a very large number of RAM arrays will still be required in such applications.

Certain characteristics of variable delay requirements in a typical application have now been recognized as background for the present invention. In such an application, considered by way of example:

(a) the maximum required delay is equal to 512 delay increments;

(b) the summation of various related variable delay values does not exceed 512 delay increments; and (c) the value of such various delays does not follow any predictable pattern (i.e., the various delay values can individually be as big as 512 delay increments, or as small as very few delay increments).

According to the conventional approach, each tap bank would require its own dedicated shift register or RAM array capable of providing 512 increments of delay, in order to implement a variable delay circuit for each individual tap bank. Thus, even with the basic advantages of RAM circuit arrangements, there remain significant manufacturing and operational costs which cannot be avoided.

It is therefore an object of this invention to provide economical variable delay circuits having a multiple-delay capability whereby a plurality of blocks of input data may simultaneously be subjected to different delays by use of only a single RAM array.

It is an additional object to provide a variable delay circuit utilizing a RAM array having a given number of storage locations, such as 512, to delay a plurality of blocks of input data by different delays which aggregate not more than 512 delay increments.

Further objects are to provide new and improved variable delay circuits having a multiple-delay capability whereby one or more blocks of input data may be simultaneously delayed corresponding to the selected delay time.

SUMMARY OF THE INVENTION

In accordance with the invention, a multiple-delay variable delay circuit, for delaying one or more blocks of input data by respective variable delays aggregating up to X delay increments, includes a memory array for storing blocks of input data at a plurality of storage locations, including locations 1 through X. A clock circuit, coupled to the memory array, determines the duration of each delay increment and an access circuit is provided for writing input data blocks into the memory array and for reading data blocks out of the memory array. A first delay control circuit, coupled to the memory array, is arranged to enable a first input data block to be delayed by a first variable delay equal to Y delay increments, by causing the access circuit to write and read the first input data block respectively into and out of storage locations 1 through Y of the memory array, where Y does not exceed X. A second delay control circuit is provided for enabling a second input data block to be delayed by a second variable delay equal to a number of delay increments not exceeding X–Y, by causing the access circuit to write and read the second input data block respectively into and out of some or all of storage locations (Y+1) through X of the memory array. A delay input circuit, coupled to the first and second delay control circuits, enables independent selection of the first and second variable delays.

The delay circuit may also include a third delay control circuit, coupled to the memory array for enabling a third input data block to be delayed by a third variable delay, by causing the access circuit to write and read the third input data block respectively into and out of a plurality of storage locations not utilized by the first and second delay control circuits.

DESCRIPTION OF THE INVENTION

Figure 1:
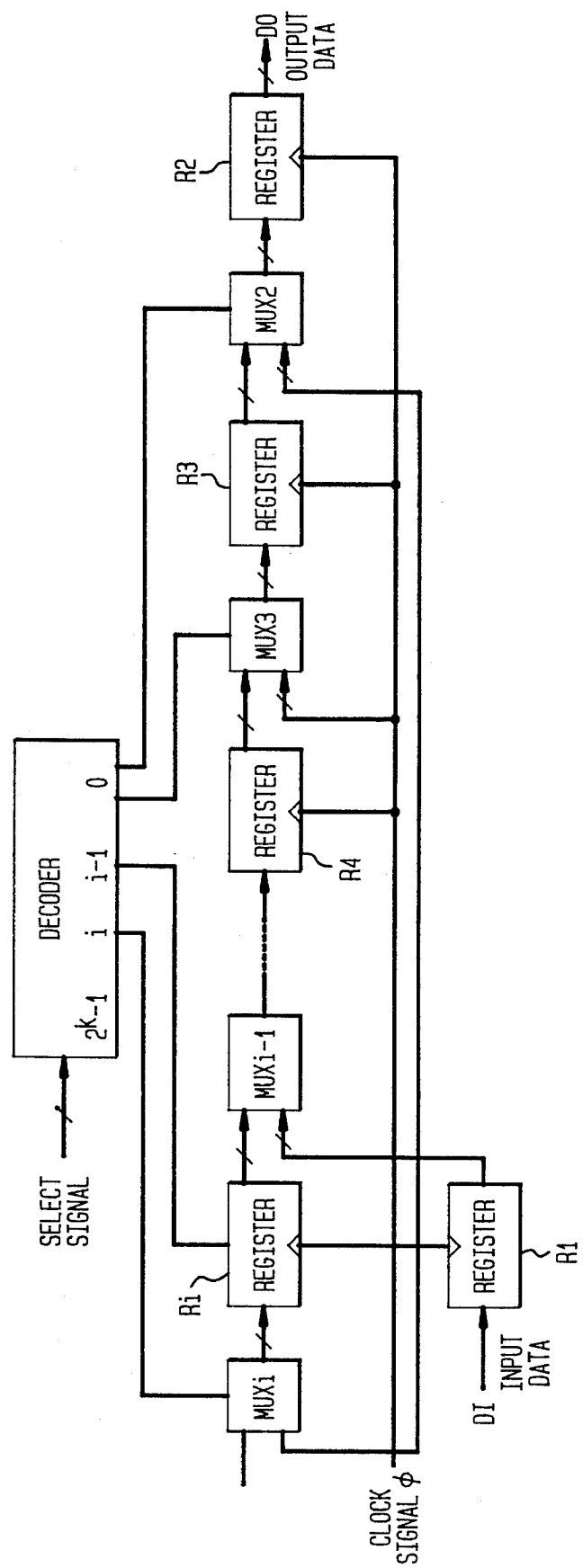
FIG. 1 is a block diagram of a prior art form of variable shift register.
Figure 2:
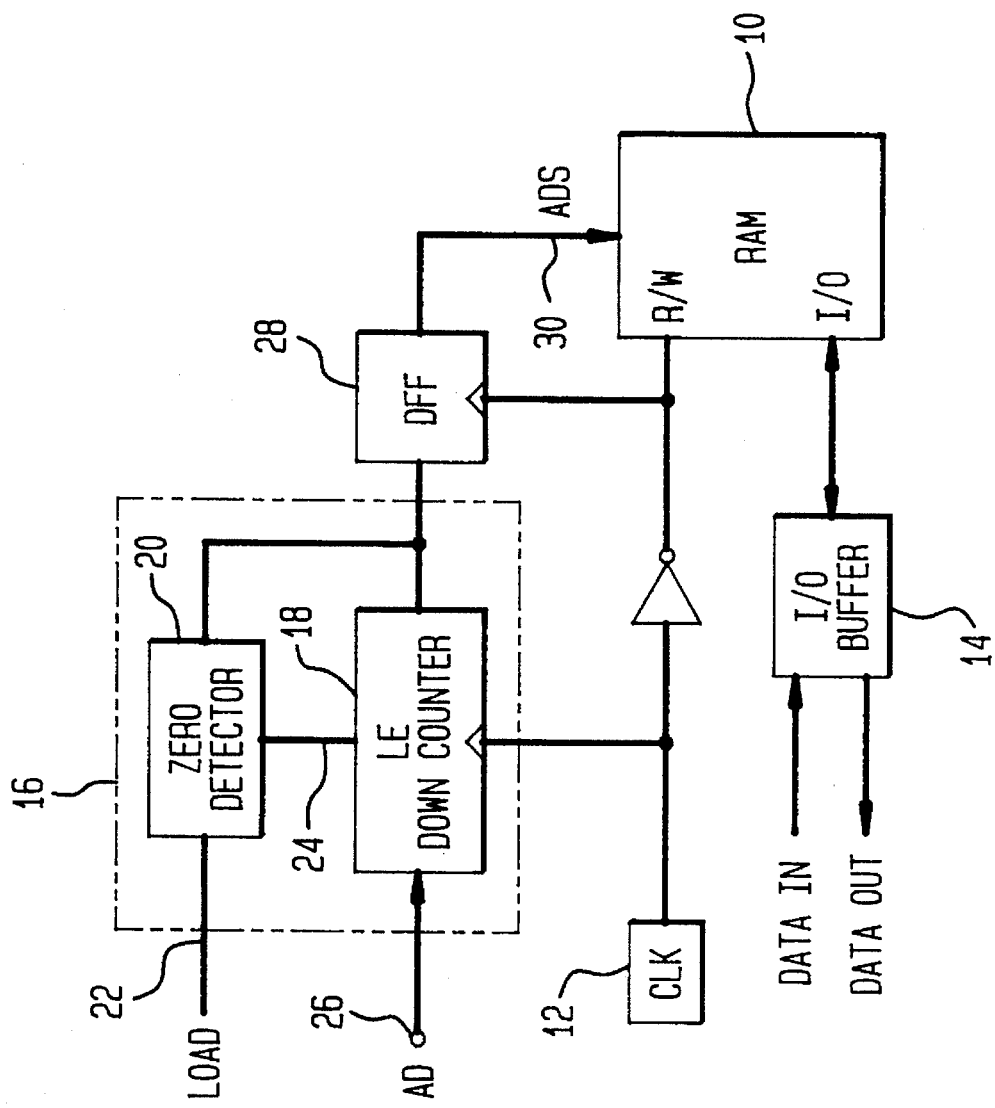
FIG. 2 is a block diagram useful in describing the basic operation of a variable delay circuit in accordance with the invention.
Figure 3:
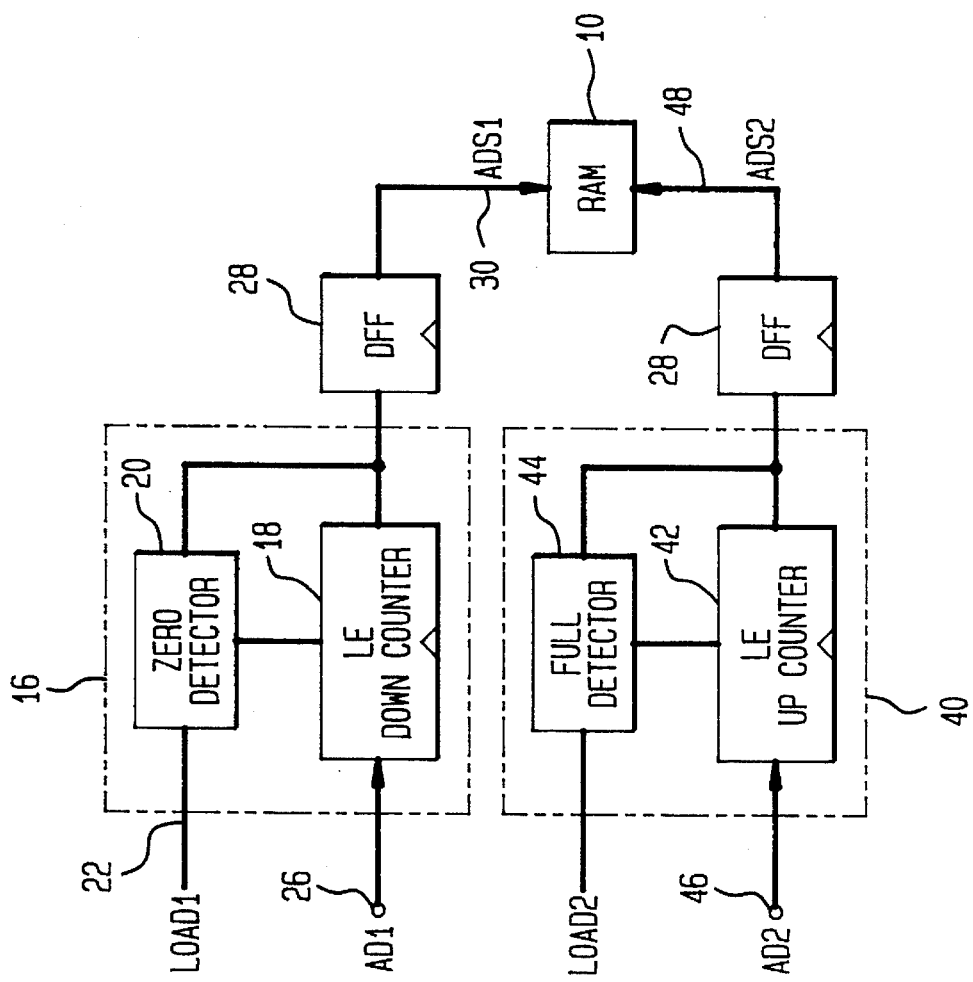
FIG. 3 is a block diagram of a variable delay circuit in accordance with the invention, which is arranged to separately delay two blocks of input data.
Figure 4:
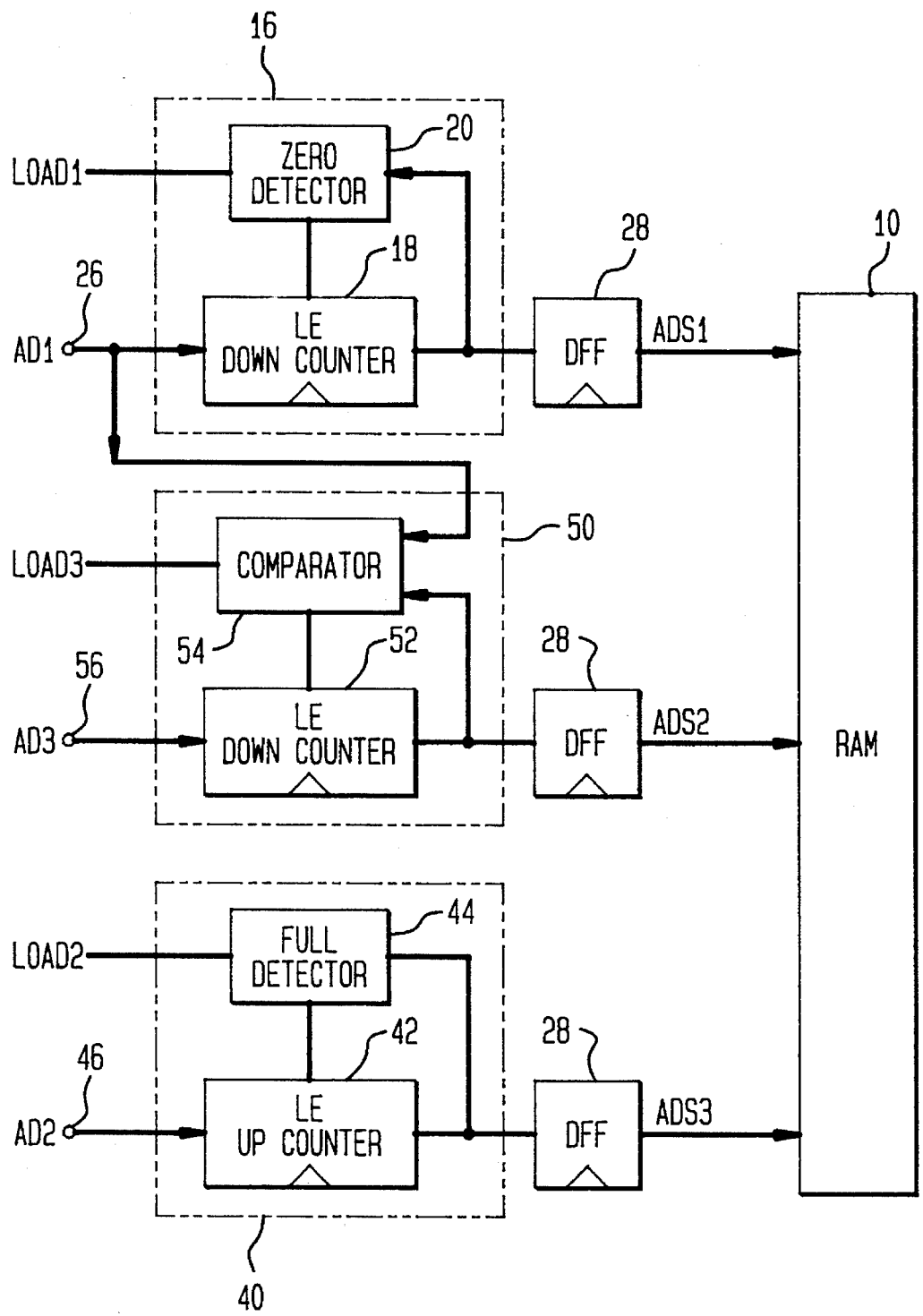
FIG. 4 shows an embodiment of the invention in which the capability of separately delaying a third block of input data has been added to a FIG. 3 type variable delay circuit.

Referring now to FIG. 2, basic operation and structure of a single input variable delay circuit will be considered before discussion of the multiple-delay configurations of FIGS. 3 and 4, whose basics are consistent with the FIG. 2 circuit. In FIG. 2, a memory array, shown as RAM 10, is provided for storing blocks of input data at a predetermined plurality of storage locations. For use in a digital communications equalizer or video ghost cancellation system, RAM 10 may be arranged to provide adequate capacity for storage of lines or frames, for example, or other forms of blocks of input data of desired size. For such purposes, RAM 10 is arranged to permit storage of such a block of input data at a plurality of storage locations equal to a maximum number of delay increments which are to be provided. For example, RAM 10 may include 512 such storage locations which, for reference purposes, may be referred to as locations 1 through 512, or, more generally, storage locations 1 through X.

As shown, the FIG. 2 circuit also includes clock means, shown as CLK 12, for controlling timing of the operation of the circuit and for thereby determining the duration of each delay increment. Basically, as will be further discussed, a delay of 50 delay increments will be achieved by reading and writing an input data block respectively into and out of a total of 50 storage locations in RAM 10 under timing control of clock 12. Access means, shown as in/out buffer 14, is provided for enabling the writing of input data blocks into, and reading such data blocks out of, RAM 10 in known manner.

The FIG. 2 variable delay circuit also includes delay control means 16 illustrated as including the combination of down counter 18 and zero detector 20. Delay control means 16 is arranged to cause an input data block to be delayed by a selected delay, e.g., Y delay increments, where Y may be any number up to the maximum number of delay increments referred to above. Thus, if a total number of storage locations X=512 are provided in RAM 10, Y may identify any number of delay increments up to, but not exceeding, 512 delay increments. Delay control means 16 causes the input data block to be delayed by Y delay increments, in this example, by causing access means 14 to read and write the data block respectively into and out of storage locations 1 through Y of RAM 10. More specifically, a LOAD signal of value 1 input at 22 to zero detector 20, causes the value of LE at input 24 to down counter 18 to also have a value of 1. This enables a variable or adjustable delay value AD to be coupled to the down counter, via delay value input port 26. Down counter 18 is thereby activated to begin counting down from Y. As shown, the value in the down counter 18 is inputted via flip-flop 28 as an address input to the RAM 10. This causes the reading and writing of the input data block respectively into and out of up to a total of Y storage locations in RAM 10 (i.e., the data block is subjected to a delay of Y delay increments) before being read out via access means 14 after the selected delay value AD equal to Y. It will be appreciated that a "read/write" cycle is commonly referred to in the computer art, because data is typically read out of a storage location before such location is over written with new data. In the present instance, reference is made to writing and then reading, with an inherent delay increment as controlled by the timing clock signals, in order to more particularly indicate the process used to delay a data block by a desired number of delay increments. At the start of the delay cycle it is assumed prior data has been read out of the initial storage location prior to, or in coordination with, the initial entry of the data block under consideration.

Referring to the FIG. 2 circuit, when down counter 18 counts down to 0 the data block delayed by an adjustable delay AD equal to Y is read out and zero detector 20 is reset to 1, again causing the value of LE at input 24 to down counter 18 to be 1 and resulting in down counter 18 being receptive to entry of a new adjustable delay value AD via delay input port 26. In this manner, each successive input data block is subjected to a selected variable delay as the data block goes through a number of write/read cycles corresponding to the respective delay selected. A delay of an input data block by any desired delay equal to a plurality of delay increments up to a predetermined maximum is thus achieved. As shown, FIG. 2 includes a flip-flop circuit 28 coupling adjustable delay signals via input 30 to an address input of RAM 10, with other connections and components as appropriate to enabling timing control of the count down, read/write, reset, etc., by use of timing signals from clock 12. FIGS. 3 AND 4 MULTIPLE-DELAY CIRCUITS Referring now to FIG. 3, there is shown an embodiment of a multiple-delay variable delay circuit in accordance with the invention. For purposes of description, reference will be made to a representative application in a ghost cancellation system wherein a large number of tap banks would typically each require a dedicated 512 storage position RAM variable delay circuit. As will be described, the present invention enables several tap banks to share a common multi-port or time-shared RAM circuit in implementing different delays for different input data blocks.

One key realization utilized in the present invention is that in such ghost cancellation system, for example, the aggregate value of various delays commonly required is less than 512 delay increments (e.g., lines of video). In other words, there is a complementary relationship between various required delay values, whereby a plurality of such delays will not exceed 512 increments of delay in the aggregate. At the same time, one individual desired delay value may alone require a delay equal to any value up to, but not exceeding, 512 increments of delay. These characteristics have now been identified as providing opportunities for the sharing of a single RAM delay circuit in order to serve several tap banks, in accordance with the invention. It is recognized that, for the same size memory, a multi-port RAM may require a larger area on a semi-conductor device than a single-port RAM. However, with increasing speeds of RAM operation made possible by continuing integrated circuit technology, the access speed of a single-port RAM can readily reach 60 MHz and higher. In the example of a ghost cancellation system, the clock rate is typically 15 MHz, therefore the variable delay circuit must read and write simultaneously at the individual speeds of 15 MHz. That is to say, a 15 MHz read port and a 15 MHz write port are required to be provided via I/O buffer 14 of FIG. 2. It will thus be seen that, by use of time to sharing, such operation requires only a single port RAM that has a speed of at least 30 MHz. Thus, in accordance with the invention, manufacturing and operating savings are achieved by use of multi-port RAMs to provide variable delays for a plurality of tap banks, and further savings and advantages are achieved by use of a single-port RAM on a time shared basis. In such configurations, with the memory size of the time shared RAM being the same as a non-shared RAM, the integrated circuit area required by the RAM may be the same as for a single input, non-shared RAM. Further, required circuitry can be reduced significantly because several tap banks can share a common set of multiple-delay variable delay circuits.

Considering the FIG. 3 circuit in view of the foregoing, it will be seen that two tap banks are enabled to share a single multiple-delay variable delay circuit provided in accordance with the invention. In FIG. 3 clock means 12 and access means 14, which will be understood to be included in the FIG. 3 circuit in the same manner as in the FIG. 2 circuit have been omitted in the interests of simplifying presentation of the multiple-delay capabilities. As shown in FIG. 3, first delay control means 16 is identical to delay control means 16 of FIG. 2 and will be understood to operate with RAM 10 under timing control of clock means arranged similarly to clock unit 12 of FIG. 2. Second delay control means 40 includes an up counter 42 coupled to a full detector 44 and similarly operates under timing control of clock means arranged similarly to clock unit 12 of FIG. 2. As shown, the FIG. 3 variable delay circuit includes delay input means, shown as delay input ports 26 and 46, enabling a first variable delay to be input as AD1 and a second variable delay AD2 to be input to second delay control means 40 at input port 46. The AD1 and AD2 delay inputs are effective to result in the respective adjustable delay signals ADS1 and ADS2 being coupled to the RAM 10, via inputs 30 and 48, in order to provide two different variable delays for two different input data blocks which may be simultaneously processed by I/O buffer 14, but separately delayed under control of the first and second control means 16 and 40.

A special feature of the invention, as illustrated in FIG. 3, is that down counter 18 counts to 0 before it loads a new delay value, while up counter 42 counts to 511 before it loads a new delay value in second delay control means 40. In this example, the RAM includes a total of X storage locations, where X equals 512, which correspond to counter indications 0 through 511. Thus, if first delay control means 16 is to provide a selected delay of Y, equal to 150 delay increments, for example, the Y delay is implemented while down counter counts from 149 to 0. Similarly, if second delay control means 40 is to provide a selected delay of Y', equal to 200 delay increments, the Y' delay is implemented while the up counter 42 counts from 312 to 511. More generally, the Y' delay in this example could utilize a total of 362 delay increments (X–Y) represented by storage locations Y+1 (the next unused storage location following Y) through X (the last storage location). As a result of operation in this manner, it is possible to implement zero detector 20 with inclusion of a single NOR gate and full detector 44 with inclusion of a single AND gate.

With reference now to FIG. 4, there is illustrated an embodiment of a multiple-delay variable delay circuit arranged for use with an I/O buffer 14 arranged to provide input and output access simultaneously for three separate input data blocks. This arrangement enables the variable delay circuit to be operatively divided to provide three or more smaller variable delay capacities. Thus, in the preceding example, with the Y delay utilizing a 150 delay increment capacity and the Y' delay utilizing a 200 delay increment capacity, a 162 delay increment capacity (512–350) remains unused. In the FIG. 4 embodiment, first and second delay control means 16 and 40 are as previously shown and described. Third delay control means 50 includes a down counter 52 and comparator 54 which is responsive to both the 0 count signal from down counter 52 and the delay input AD3 at input port 56.

The comparator 54 essentially monitors the storage locations utilized by the delay control circuit 16 by storing the delay AD1 inputted to the delay control circuit 16 and comparing this AD1 value with the output of the down counter 52. When they are equal, the comparator 54 causes the third data block to be outputted and causes the down counter 52 to load a new delay AD3. Comparator means 54 is effective to control operation of third delay control means 50 to cause a third variable delay value Y" input at delay input port 56 to be implemented by writing a third data input block into RAM 10 storage locations not utilized by the first and second delay control means 16 and 40. It will be understood that delay control means 50 is arranged to operate under timing control of clock means such as clock 12 of FIG. 2, in the manner previously described with reference to delay control means 16 and 40. While inclusion of comparator 54 necessitates a higher hardware cost (higher than the zero detector and full detector circuits of delay control means 16 and 40) additional variable delay capabilities are provided without adding RAM arrays. Overall, the invention provides improved manufacturing and operational economies, without compromising efficiency or integrity of performance.

While there have been described the currently preferred embodiments of the invention, those skilled in the art will recognize that other and further modifications may be made without departing from the invention and it is intended to claim all modifications and variations which fall within the scope of the invention.

What is claimed is:

1. A multi-input variable delay circuit, for delaying one or more blocks of input data by respective variable delays aggregating up to X delay increments, comprising:

a memory array comprising a plurality of storage locations numbered 1 through X;

clock coupled to said memory array, wherein said clock determines a duration of one or more delay increments of said one or more blocks of input data;

an access circuit, coupled to said memory array, which writes input data blocks into said memory array and reads data blocks out of said memory array;

a first delay control circuit, coupled to said memory array and to said clock, which enables a first input data block to be delayed by a first variable delay equal to Y delay increments, by causing said access circuit to write said first input data block into a first portion of said memory array, and to read said first input data block out of said first portion of said memory array, wherein said first portion of said memory array comprises only storage locations numbered 1 through Y of said memory array, where Y does not exceed X; and a second delay control circuit, coupled to said memory array and to said clock and responsive to a signal indicative of the value Y, which enables a second input data block to be delayed by a second variable delay equal to Y' delay increments wherein Y' does not exceed X–Y, by causing said access circuit to write said second input data block into a second portion of said memory array and read said second input data block out of said second portion of said memory array, wherein said second portion of said memory array comprises Y' storage locations of said X–Y storage locations numbered (Y+1) through X of said memory array.

2. A variable delay circuit as in claim 1 further comprising delay input circuit, coupled to said first and second delay control circuit, for enabling independent selection of said first and second variable delays.

3. A variable delay circuit as in claim 1, wherein said memory array comprises a random access memory array arranged to be accessed on a time-shared basis via a single input/output port.

4. A variable delay circuit as in claim 1, wherein said memory array includes storage locations 1 through 512, wherein said first delay control circuit is arranged to cause said first input data block to be delayed by a first variable delay of up to 512 delay increments, and wherein said second delay control circuit is arranged to cause said second input data block to be delayed by second second variable delay not exceeding the difference between said first variable delay and 512 delay increments.

5. A variable delay circuit as in claim 1, wherein said first delay control circuit includes a down counter arranged for counting down from Y to 0, wherein and said second delay control circuit includes an up counter arranged for counting up from a number greater than Y.

6. A variable delay circuit as in claim 1, additionally comprising:
a third delay control circuit, coupled to said memory array, for enabling a third input data block to be delayed by a third variable delay, by causing said access circuit to write and read said third input data block respectively into and out of a plurality of said storage locations other than said storage locations utilized by said first and second delay control circuit.

7. A variable delay circuit as in claim 6, wherein said memory array comprises a random access memory array arranged to be accessed on a time-shared basis via a single input/output port.

8. A variable delay circuit as in claim 6, wherein said first delay control circuit includes a down counter arranged for counting down from Y to 0, and said wherein second delay control circuit includes an up counter arranged for counting up from a number greater than Y.

9. A variable delay circuit as in claim 8, wherein said third delay control circuit includes a comparator arranged for monitoring said storage locations utilized by said first delay control means.

10. A multi-input variable delay circuit, for delaying one or more blocks of input data by respective variable delays aggregating up to X delay increments, comprising:
a memory array comprising a plurality of storage locations, including locations 1 through X;
a clock coupled to said memory array, wherein said clock determines a duration of one or more delay increments of said one or more blocks;
an access circuit, coupled to said memory array, which writes input data blocks into said memory array and reads data blocks out of said memory array;
a first delay control circuit, coupled to said memory array and to said clock, which enables a first input data block to be delayed by a first variable delay equal to Y delay increments, by causing said access circuit to write said first input data block into a first portion of said memory array, and to read said first input data block out of said first portion of said memory array wherein said first portion of said memory array comprises only Y storage locations of said memory array, where Y does not exceed X; and
a second delay control circuit, coupled to said memory array and to said clock and responsive to a signal indicative of the value Y, which enables a second input data block to be delayed by a second variable delay, by causing said access circuit to write said second input data block into a second portion of said memory array, and read said second input data block out of said second portion of said memory array, wherein said second portion of said memory array comprises a total number of said storage locations Y', wherein said Y' storage locations do not exceed X–Y storage locations, and wherein said Y' storage locations are storage locations other than said Y storage locations utilized by said first delay control circuit.

11. A variable delay circuit as in claim 10 further comprising delay input circuit, coupled to said first and second delay control circuit, for enabling independent selection of said first and second variable delays.

12. A variable delay circuit as in claim 10, wherein said memory array comprises a random access memory array arranged to be accessed on a time-shared basis via a single input/output port.

13. A variable delay circuit as in claim 10, wherein said first delay control circuit includes a down counter arranged for counting down from Y to 0, and said second delay control circuit includes an up counter arranged for counting up from a number greater than Y.

14. A multi-input variable delay circuit, for delaying one or more blocks of input data by are respective variable delays aggregating up to X delay increments, comprising:
a memory array for storing blocks of input data at a plurality of storage locations, including locations 1 through X;
a clock coupled to said memory array, wherein said clock determines a duration of one or more delay increments of said one or more blocks;
an access circuit, coupled to said memory array, which writes input data blocks into said memory array and reads data blocks out of said memory array:
a first delay control circuit, coupled to said memory array and to said clock, which enables a first input data block to be delayed by a first variable delay equal to Y delay increments, by causing said access circuit to write said first input data block into a first portion of said memory, and to read said first input data block out of said first portion, wherein said first portion comprises Y storage locations of said memory array, where Y does not exceed X; and
a second delay control circuit, coupled to said memory array and to said clock and responsive to a signal indicative of the value Y, which enables a second input data block to be delayed by a second variable delay, by causing said access circuit to write said second input data block into a second portion of said memory array, and read said second input data block out of said second portion of said memory array, wherein said second portion of said memory array comprises a total number of said storage. locations Y', wherein said Y' storage locations do not exceed X–Y storage locations, and wherein said Y' storage locations are storage locations other than said Y storage locations utilized by said first delay control circuit, and wherein said second delay control circuit includes a comparator arranged for monitoring said storage locations utilized by said first delay control circuit.

15. A variable delay circuit as in claim 10, wherein said second delay control means includes a comparator means for controlling operation of said second delay control circuit to cause said second data input block to be written into storage locations not utilized by said first delay control circuit.

16. A multi-input variable delay circuit, for delaying one or more blocks of input data by respective variable delays aggregating up to X delay increments, comprising:

a memory array comprising X storage locations 1 through X;

a clock coupled to said memory array, wherein said clock determines a duration of one or more delay increments of said one or more blocks of input data;

an access circuit, coupled to said memory array, which writes input data blocks into said memory array and reads data blocks out of said memory array;

a first delay control circuit, coupled to said memory array and to said clock, which enables a first input data block to be delayed by a first variable delay equal to Y delay increments, by causing said access circuit to write said first input data block into a first portion of said memory array, and to read said first input data block out of said first portion of said memory array, wherein said first portion of said memory array comprises only Y storage locations 1 through Y of said X storage locations of said memory array, where Y does not exceed X; and a second delay control circuit, coupled to said memory array and to said clock, which enables a second input data block to be delayed by a second variable delay equal to a number of delay increments not exceeding X–Y, by causing said access circuit to write said second input data block into a second portion of said memory array, and to read said second input data block out of said second portion of said memory array, wherein said second portion of said memory array comprises some or all of X–Y storage locations Y+1 through X of said X storage locations of said memory array, wherein said second delay control circuits receives a signal indicative of the value Y, and wherein said second delay control circuit includes a comparator for controlling operation of said second delay control circuit to cause said input block to be written into storage locations other than said Y storage locations utilized by said first delay control circuit.

* * * * *